(12) United States Patent
Okinaka et al.

(10) Patent No.: US 7,604,873 B2
(45) Date of Patent: Oct. 20, 2009

(54) ORGANIC LIGHT EMITTING DEVICE

(75) Inventors: Keiji Okinaka, Kawasaki (JP); Akihito Saitoh, Yokohama (JP); Naoki Yamada, Inagi (JP); Masataka Yashima, Tokyo (JP); Koichi Suzuki, Yokohama (JP); Akihiro Senoo, Kawasaki (JP); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 648 days.

(21) Appl. No.: 11/175,206

(22) Filed: Jul. 7, 2005

(65) Prior Publication Data

US 2006/0017376 A1 Jan. 26, 2006

(30) Foreign Application Priority Data

Jul. 20, 2004 (JP) ............................. 2004-211231

(51) Int. Cl.
*H01L 51/54* (2006.01)
(52) U.S. Cl. .................. 428/690; 428/917; 313/504; 313/506
(58) Field of Classification Search .......... 428/690, 428/917, 212; 313/504, 506
See application file for complete search history.

(56) References Cited

U.S. PATENT DOCUMENTS

| 4,539,507 | A |  | 9/1985 | VanSlyke et al. ............. 313/504 |
| 4,720,432 | A |  | 1/1988 | VanSlyke et al. ............. 428/457 |
| 4,885,211 | A |  | 12/1989 | Tang et al. ................... 428/457 |
| 5,130,603 | A |  | 7/1992 | Tokailin et al. .............. 313/504 |
| 5,151,629 | A |  | 9/1992 | VanSlyke ..................... 313/504 |
| 5,227,252 | A |  | 7/1993 | Murayama et al. ........... 428/690 |
| 5,247,190 | A |  | 9/1993 | Friend et al. .................. 257/40 |
| 5,317,169 | A |  | 5/1994 | Nakano et al. ................. 257/40 |
| 5,383,477 | A |  | 1/1995 | DeMatteis .................... 128/898 |
| 5,409,783 | A |  | 4/1995 | Tang et al. ................... 428/690 |
| 5,514,878 | A |  | 5/1996 | Holmes et al. ................. 257/40 |
| 5,672,678 | A |  | 9/1997 | Holmes et al. ............... 528/373 |
| 5,726,457 | A |  | 3/1998 | Nakano et al. ................. 257/40 |
| 6,093,864 | A |  | 7/2000 | Tokailin et al. ................. 585/25 |
| 6,392,250 | B1 | * | 5/2002 | Aziz et al. ..................... 257/40 |
| 6,652,997 | B2 |  | 11/2003 | Suzuki et al. ................ 428/690 |
| 6,759,146 | B2 |  | 7/2004 | Aziz et al. ................... 428/690 |
| 6,910,933 | B1 | * | 6/2005 | Matsuo et al. ................ 445/24 |
| 2002/0071963 | A1 | * | 6/2002 | Fujii ........................... 428/690 |
| 2003/0134146 | A1 |  | 7/2003 | Aziz et al. ................... 428/690 |
| 2004/0253389 | A1 |  | 12/2004 | Suzuki et al. ................ 428/1.1 |

(Continued)

FOREIGN PATENT DOCUMENTS

EP 1215945 * 6/2002

(Continued)

OTHER PUBLICATIONS

Tang, et al.; "Organic electroluminescent diodes"; Appl. Phys. Lett., vol. 51, No. 12, pp. 913-915 (1987).

(Continued)

*Primary Examiner*—Dawn Garrett
(74) *Attorney, Agent, or Firm*—Fitzpatrick, Cella, Harper & Scinto

(57) ABSTRACT

It is an object of the present invention to provide an organic light emitting device having a long-life optical output. The organic light emitting device according to the present invention is provided with an emission layer including at least a host material, a light emitting material, and another material, wherein the another material has a smaller ionization potential than and almost the same hole mobility as or a greater hole mobility than an ionization potential and a hole mobility of a compound which forms an emission layer-side-interface.

3 Claims, 5 Drawing Sheets

U.S. PATENT DOCUMENTS

| | | | |
|---|---|---|---|
| 2004/0265632 A1* | 12/2004 | Okinaka et al. | 428/690 |
| 2005/0106414 A1 | 5/2005 | Saitoh, et al. | 428/690 |
| 2005/0118456 A1 | 6/2005 | Hamada et al. | 428/690 |
| 2005/0123797 A1* | 6/2005 | Kondakova et al. | 428/690 |
| 2005/0236974 A1 | 10/2005 | Suzuki, et al. | 313/504 |
| 2005/0236977 A1 | 10/2005 | Yamada, et al. | 313/504 |
| 2005/0244670 A1 | 11/2005 | Saitoh, et al. | 428/690 |

FOREIGN PATENT DOCUMENTS

| | | |
|---|---|---|
| JP | 02-247278 | 10/1990 |
| JP | 03-255190 | 11/1991 |
| JP | 04-145192 | 5/1992 |
| JP | 05-202356 | 8/1993 |
| JP | 05-247460 | 9/1993 |
| JP | 09-202878 | 8/1997 |
| JP | 09-227576 | 9/1997 |
| JP | 2000-106277 | 4/2000 |
| JP | 2002-43063 | 2/2002 |
| JP | 2003-151777 | 5/2003 |

OTHER PUBLICATIONS

Burroughes, et al.; "Light-Emitting Diodes based on conjugated polymers"; Nature, vol. 347, pp. 539-541 (1990).

Translation of Office Action dated May 30, 2008 in counterpart Chinese application.

* cited by examiner

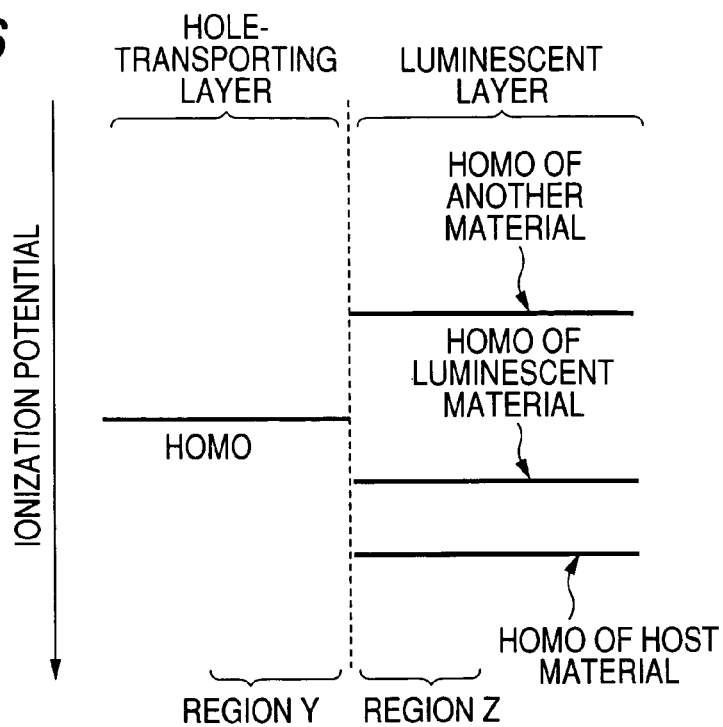
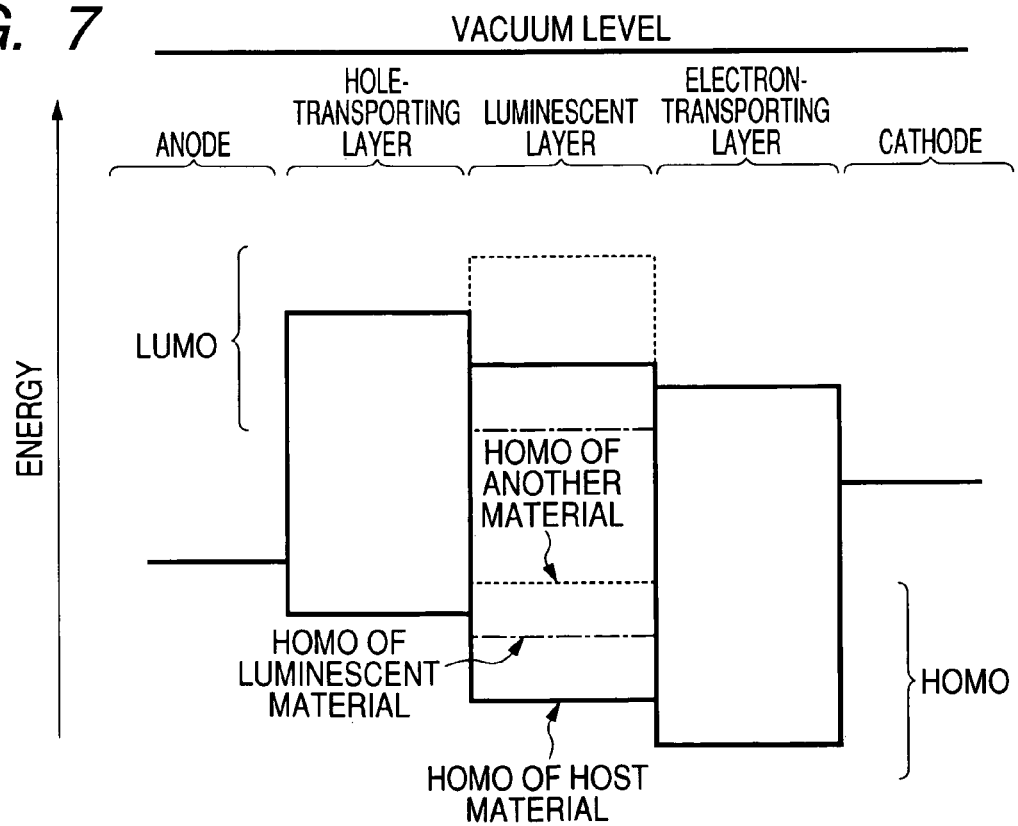

ORGANIC LIGHT EMITTING DEVICE

BACKGROUND OF THE INVENTION

1. Field of the Invention

The present invention relates to a light emitting device using an organic compound, and more specifically, to an organic light emitting device from which light is emitted by applying an electric field on a thin film made of an organic compound.

2. Related Background Art

An organic light emitting device is a device that includes a thin film made of an emitting organic compound between an anode and a cathode, generates an exciton from the fluorescent organic compound by injection of an electron and a hole from each electrode, and utilizes light to be radiated when the exciton returns to the ground state.

A study conducted by Eastman Kodak Company in 1987 (Appl. Phys. Lett. 51, 913 (1987)) reported light emission in the order of 1,000 cd/m$^2$ at an applied voltage of about 10 V, from a device having a separated-function type two-layer structure in which an anode is made of ITO and a cathode is made of a magnesium-silver alloy, an aluminum quinolinol complex is used as each of an electron-transporting material and a light emitting material, and also a triphenylamine derivative is used as a hole-transporting material. Related patents include U.S. Pat. Nos. 4,539,507, 4,720,432, and 4,885,211.

In addition, luminance at spectra ranging from ultraviolet through infrared is allowed by changing the type of the fluorescent organic compound. Recently, therefore, various compounds have been studied extensively and described in, for example, U.S. Pat. Nos. 5,151,629, 5,409,783 and 5,382,477, and Japanese Patent Application Laid-Open Nos. H2-247278, H3-255190, H5-202356, H9-202878 and H9-227576.

Furthermore, in addition to organic light emitting devices using low molecular weight materials as described above, an organic light emitting device using a conjugated polymer has been reported by a group from Cambridge University (Nature, 347, 539 (1990)). This report confirmed luminance from a monolayer by film formation with polyphenylene vinylene (PPV) in a coating system. Patents relating to an organic light emitting device using a conjugated polymer include U.S. Pat. Nos. 5,247,190, 5,514,878, 5,672,678, and Japanese Patent Application Laid-Open Nos. H4-145192 and H5-247460.

Recent advances in technology concerning organic light emitting devices have been remarkable. The characteristics of such devices allow the formation of thin and lightweight light-emitting devices having high luminance at a low applied voltage, a variety of emission wavelengths, and high-speed response, suggesting that these devices could be put to extensive use. However, many problems still remain to be solved in terms of durability, such as luminescence degradation over time by prolonged use.

In order to solve this problem, Japanese Patent Application Laid-Open No. 2002-43063 and U.S. Pat. No. 6,392,250 disclose a stacked-type organic light emitting device in which the emission layer is a mixed layer consisting of hole-transporting material, electron-transporting material and an emitter. This mixed layer suppresses the generation of unstable cationic species (holes) of the electron-transporting material, whose purpose is to improve operational durability. However, such a combination of a hole-transporting material and electron-transporting material has been often ineffective to improve the durability, and furthermore, no consideration has been given to deterioration of the emitter. In addition, these patent documents basically relates to an emission layer, so that a combination thereof with other layers has been often found ineffective.

Japanese Patent Application Laid-Open No. 2003-151777 discloses an organic light emitting organic device which employs a mixed layer of a hole-transporting material and an electron-transporting material, and is capable of further adding a light emitting material. In this device, selecting a material different from the mixed layer for the hole-transporting region or electron-transporting region provides the advantages of improving efficiency and stability due to blocking of charge leakage/exciton diffusion, increasing the degree of freedom in material selection, and increasing economic efficiency. However, the above advantages are merely the advantages of an ordinary stacked structure, and are not just limited to a device using a mixed layer as an emission layer. In addition, no consideration is given to deterioration of the emitting material.

Japanese Patent Application Laid-Open No. 2000-106277 discloses an organic light emitting organic device in which the emission layer contains a host material, a polycyclic aromatic hydrocarbon, and a fluorescent dye, wherein the hole mobility of the polycyclic aromatic hydrocarbon is greater than that of the host compound. This prior art is directed to prolonging the life of a device by suppressing hole accumulation in the host material of the emission layer by using a high hole-mobility polycyclic aromatic hydrocarbon. However, because the highest occupied orbital of the fluorescent dye is at an energy level equal to or higher than that of the polycyclic aromatic hydrocarbon, there is the problem that hole accumulation in the fluorescent dye occurs. In addition, this prior art basically relates to an emission layer, so that a combination thereof with other layers does not achieve the required effects in some cases.

SUMMARY OF THE INVENTION

An object of the present invention is to provide an organic light emitting device having a long-life optical output.

The present inventors have accomplished the present invention as a result of their extensive studies into solving the above problem. That is, the organic light emitting device according to the present invention includes: a pair of electrodes, which consist of an anode and a cathode, and a plurality of organic layers interposed between the pair of electrodes, wherein the plurality of organic layers includes at least an emission layer and another organic layer which is in contact with an anode-side-interface of the emission layer, and wherein the emission layer includes at least:

(1) a host material;

(2) a light emitting material; and (3) another material having a smaller ionization potential than and almost the same hole mobility as or a greater hole mobility than an ionization potential and a hole mobility of a compound which constitutes an emission layer-interface-side of the another organic layer.

Accordingly, the present invention can provide an organic light emitting device remarkably excellent in stability with elapse of time.

BRIEF DESCRIPTION OF THE DRAWINGS

FIG. 6 is a diagram explaining the principle of the prolonged life in accordance with the present invention;

FIG. 7 is an example of an energy diagram of an organic light emitting device in accordance with the present invention;

DETAILED DESCRIPTION OF THE PREFERRED EMBODIMENTS

Figure 1:
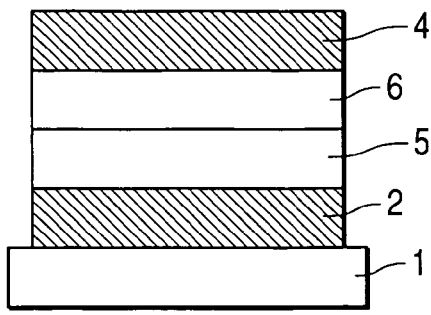
FIG. 1 is a cross-sectional view showing an example of the organic light emitting device in accordance with the present invention.

The present invention will now be described in detail. FIGS. 1 to 5 are schematic diagrams which illustrate structural examples of the organic light emitting device in accordance with the present invention.

First, the reference numerals in each of the drawings will be explained.

Reference numeral 1 denotes a substrate, 2 an anode, 3 an emission layer, 4 a cathode, 5 a hole-transporting layer, 6 an electron-transporting layer, 7 a hole injection layer, 8 a hole/exciton-blocking layer and 9 an electron/exciton-blocking layer.

FIG. 1 shows an organic light emitting device constructed by mounting the anode 2, the hole-transporting layer 5, the electron-transporting layer 6 and the cathode 4 on the substrate 1 in mentioned order. In this situation, the light emitting region is in the electron-transporting layer 6, wherein the electron-transporting layer 6 serves as the emission layer.

Figure 2:
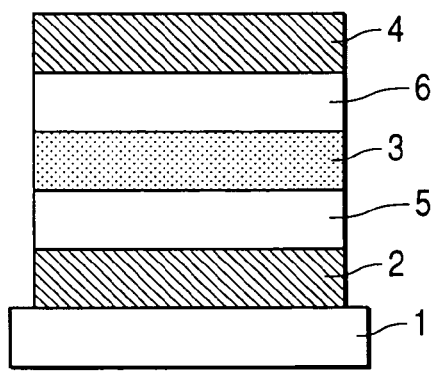
FIG. 2 is a cross-sectional view showing another example of the organic light emitting device in accordance with the present invention.

FIG. 2 shows an organic light emitting device constructed by mounting the anode 2, the hole-transporting layer 5, the emission layer 3, the electron-transporting layer 6, and the cathode 4 on the substrate 1 in mentioned order. In this case, the carrier-transportation function and the luminescence function are separated, wherein compounds having each of the characteristics of hole-transport, electron-transport and luminance can be used in a suitable combination. This greatly increases the degree freedom of selecting materials, as well as enabling a variety of compounds which differ in their wavelength to be used, which in turn allows the luminance hue to diversify. Further, by effectively confining each carrier or exciton in the middle emission layer 3, luminescence efficiency can be increased.

Figure 3:
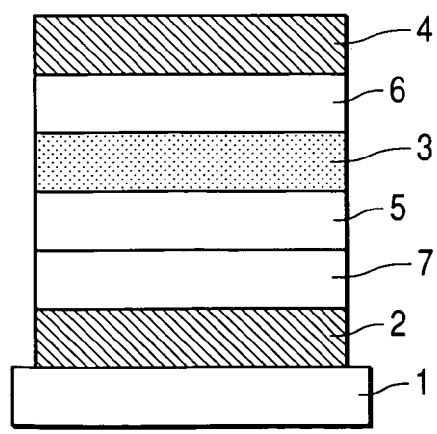
FIG. 3 is a cross-sectional view showing still another example of the organic light emitting device in accordance with the present invention.

FIG. 3 is different from FIG. 2 in that the hole injection layer 7 is inserted in the layer structure on the side of the anode 2. The insertion is effective in improving the close contact between the anode 2 and the hole-transporting layer 5 or improving the hole-implanting ability. Therefore, such a configuration of the device will be advantageous in lowering the voltage of the device.

Figure 4:
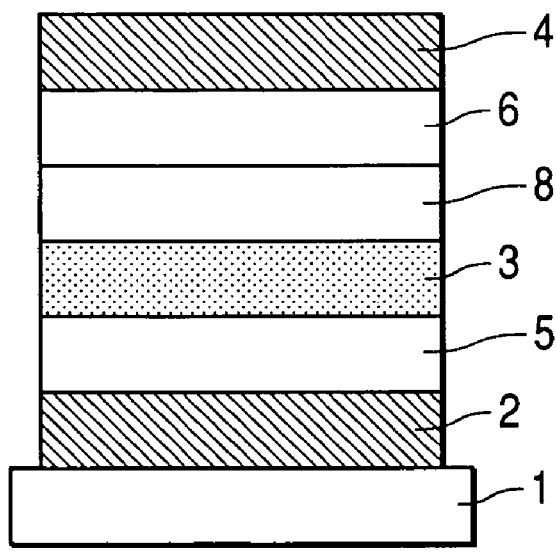
FIG. 4 is a cross-sectional view showing still another example of the organic light emitting device in accordance with the present invention.

FIG. 4 is different from FIG. 2 in that a layer for preventing a hole or exciton from traveling toward the side of the cathode 4 (hole/exciton-blocking layer 8) is inserted between the emission layer 3 and the electron-transporting layer 6. Using a compound having a large ionization potential as the hole/exciton-blocking layer 8 efficiently provides the configuration of the device with improved luminescence efficiency.

Figure 5:
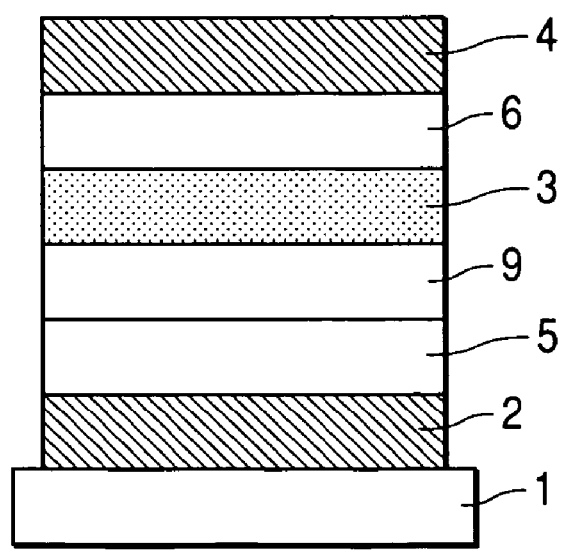
FIG. 5 is a cross-sectional view showing still another example of the organic light emitting device in accordance with the present invention.

FIG. 5 is different from FIG. 2 in that a layer for preventing an electron or exciton from traveling toward the side of the anode 2 (electron/exciton-blocking layer 9) is inserted between the emission layer 3 and the hole-transporting layer 5. Using a compound having a small electron affinity as the electron/exciton-blocking layer 9 efficiently provides the configuration of the device with improved luminescence efficiency.

A structure such as that described above often adopts a structure as the emission layer in which a luminescent dopant (light-emitting material) is doped into the host material. Doping increases the degree of freedom with which the respective functions of charge mobility, recombination, and luminescence can be optimized in the emission layer, whereby luminescence efficiency can be improved and a diversified luminance hue can be achieved.

The emission layer can also be formed from a plurality of layers each having a different luminescent color, wherein the emissions from the respective layers are mixed for use.

The present invention relates, among the device structure examples explained above, to a structure having an emission layer and another organic layer provided on the anode side of the emission layer. This another organic layer denotes the hole-transporting layer in FIGS. 1 to 4, and the electron/exciton-blocking layer in FIG. 5. While the principle of the present invention is explained using the structure shown in FIG. 2, the present invention is not limited thereto, and can achieve its effects in a similar manner even with a different structure.

As a result of extensive study on the causes of luminance degradation which occurs when an organic light emitting device is operated, the present inventors have ascertained that a major cause of degradation is hole accumulation in the hole-transporting region, and further, hole accumulation in the emitting material contained in the emission layer, and have proposed a method to solve this problem.

The principle of prolonging life in accordance with the present invention will be explained using the energy diagram shown in FIG. 6. In the present invention, the emission layer is constituted from at least three kinds of material. These three kinds are a host material, a light emitting material and another material that will be explained below. Compared with a compound which constitutes the region Y on the emission layer-interface-side of the hole-transporting material, this another material: (1) has a smaller ionization potential (i.e. a lower HOMO energy level); and (2) has almost the same or greater hole mobility (i.e. the holes move more rapidly). This another material is preferably contained at least in the region Z of the hole-transporting layer side of the emission layer. "Almost the same hole mobility" can mean a hole mobility ratio in the range of from 0.2 to 5 or more.

Based on the action of this another material, the holes implanted from the anode can be expected to be quickly implanted into the emission layer after being transported through the hole-transporting layer. As a result, the hole accumulation in the hole-transporting layer is moderated. When the another material of the present invention is not present, holes accumulate at the emission layer-side-interface of the hole-transporting layer, thereby becoming a factor in device deterioration.

To prevent hole accumulation in the emitting material contained in the emission layer, it is effective when the ionization potential of the above another material is less than the ionization potential of the emitting material (i.e. the another material has a lower HOMO energy level). This is because the holes implanted into the emission layer preferentially flow through the energy-stable another material in comparison with the emitting material.

Thus, holes implanted into the emission layer recombine with electrons implanted from the cathode to thereby generate an exciton, whereupon light is emitted mainly from the emitting material. Although recombination preferably takes place on the emitting material molecules (direct recombination luminescence), excitons that recombine on a host material molecule or another material molecule also move by their energy to the emitting material molecule, whereby the emitting material ultimately emits light.

Based on the above principle, one example of a device structure which is effective in improving durability is shown below. In the device structure illustrated in FIG. 7, the emission layer is a mixed layer consisting of the three kinds of a host material, a light emitting material and another material. In order to achieve efficient luminance from the emitting material, it is preferable that (1) the energy band gap of the emitting material is lower than both energy band gaps of the host material and the another material; and (2) the ionization potential of the host material is greater than the ionization potential of the emitting material.

In addition, to achieve the above-described suppression effect of hole accumulation in the hole-transporting layer and the suppression effect of hole accumulation in the emitting material, the concentration of the another material in the emission layer is preferably from 1% to 40%, and more preferably from 5% to 30%. Meanwhile, the concentration of emitting material is preferably from 0.1% to 40%, and more preferably from 1% to 30%.

In terms of reliability, the host material is preferably a material having good film-formability/durability, and usually a material that has a high glass transition temperature. In addition, in order that the emitting material and the separate material are evenly dispersed in the emission layer, it is important to select a host material having good compatibility.

The emitting material may be fluorescent (luminescence from a singlet excited state) or phosphorescent (luminescence from a triplet excited state). However, when a phosphorescent emitting material is used, it is necessary that the another material used in the emission layer has a higher triplet energy than the phosphorescent emitting material in order to achieve efficient luminance from the emitting material.

The organic light emitting device according to the present invention may be constituted from a low molecular weight material, a high molecular weight material, or a combination thereof. Further, the emission wavelength is not restricted, and may be from ultraviolet to visible light, or even infrared.

Although the material for emitting light may be a light emitting material in which a plurality of emitting materials are mixed in the emission layer (e.g. a material which achieves white-light luminescence through mixing emitting materials of the colors red, green and blue in the emission layer), in such a case, the ionization potential of the another material must be smaller than the ionization potential of at least one of the emitting materials, and preferably, the ionization potential of the another material has an ionization potential lower than the lowest ionization potential among the plurality of emitting materials.

Ionization potential and HOMO energy can be determined from UPS (ultraviolet photoelectron spectroscopy) or other method (e.g. measuring instrument model AC-1 (manufactured by Riken Kiki Co., Ltd.), or by determining the oxidation potential by cyclic voltammetry. LUMO energy can be determined through calculation of the band gap value from light absorption and the HOMO energy or by determining the reduction potential by cyclic voltammetry. Further, the HOMO and LUMO energy levels can be predicted by simulated calculations using the molecular orbital method, density functional formalism or other methods.

Hole mobility can be measured by transient current measurement using a TOF (Time of Flight) method. It is suitable that the magnetic field strength at the time of the measurement is about $1 \times 10^5$ V/cm to about $1 \times 10^6$ V/cm.

Triplet energy can usually be determined from phosphorescence spectra.

Furthermore, known materials can be used as necessary in the organic layers (the hole injection layer, hole-transporting layer, electron-transporting layer, emission layer etc.) which constitute the device.

Examples of these compounds will be given below.

A preferable hole-injecting/transporting material has excellent mobility to facilitate the injection of a hole from an anode and to transport the implanted hole to an emission layer. Low molecular and high molecular materials having hole-implanting/transporting abilities include triarylamine derivatives, phenylene diamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, and poly(vinylcarbazole), poly(silylene), poly(thiophene), and other conductive polymers. However, the material is not limited to those compounds. Some specific examples of the material will now be described.

Low-Molecular Weight Hole-Injecting/Transporting Materials

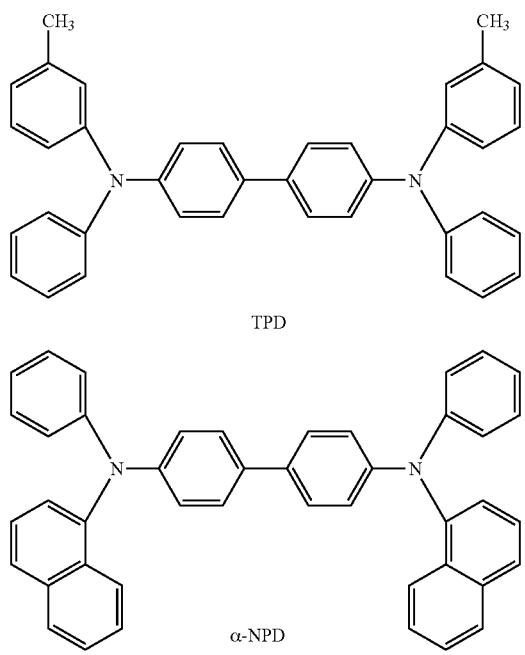

-continued
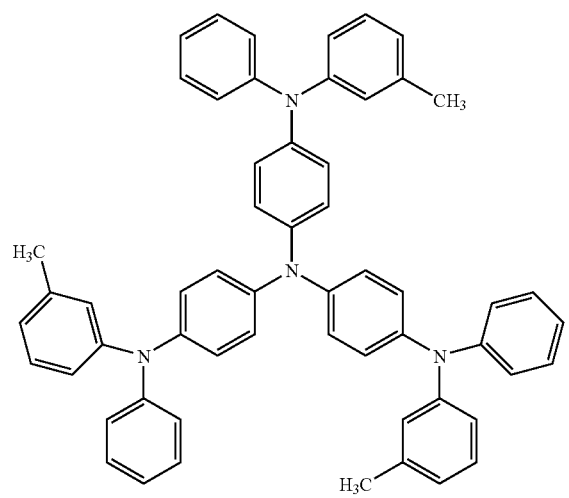
m-MTDATA
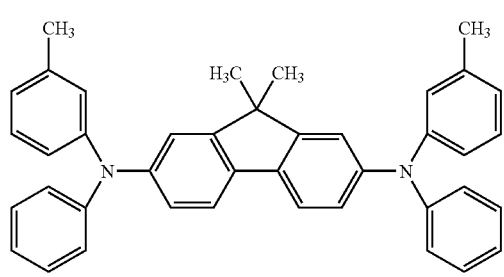
DTDPFL
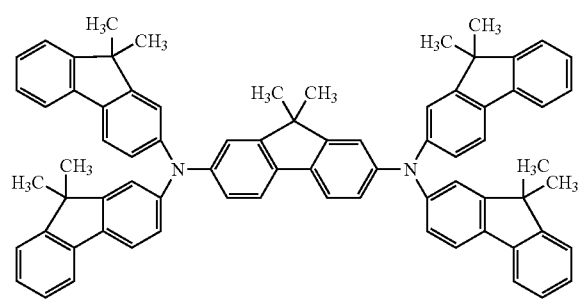
TFLFL
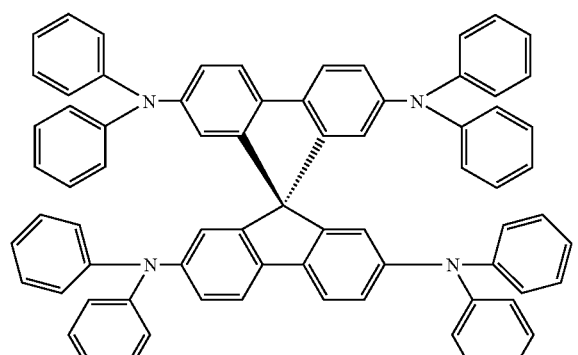
spiro-TPD
-continued
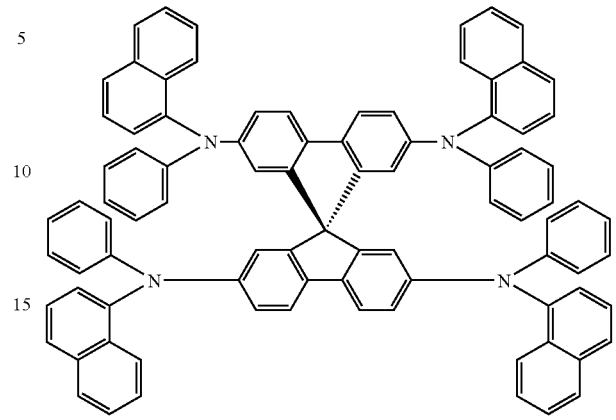
spiro-NPD
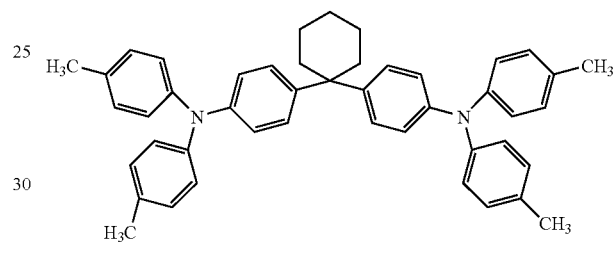
TBAC
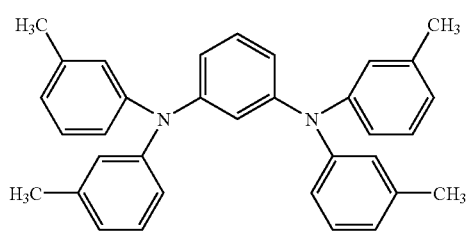
PDA
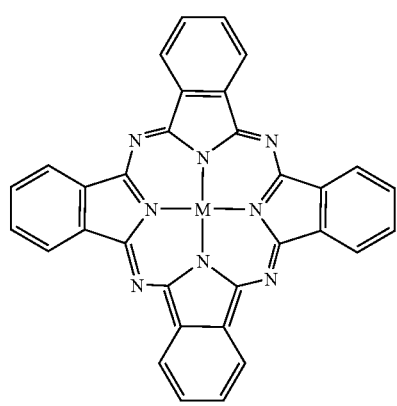
Pc-M
M : Cu, Mg, AlCl, TiO, SiCl2, Zn, MnCl, GaCl, etc High-Molecular Weight Hole-Injecting/Transporting Materials
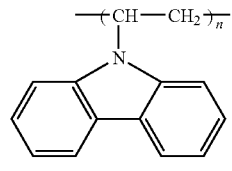
PVCz
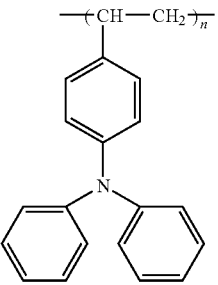
DPA-PS
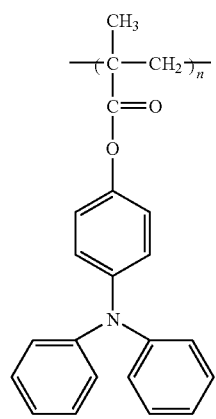
TPA-PMMA
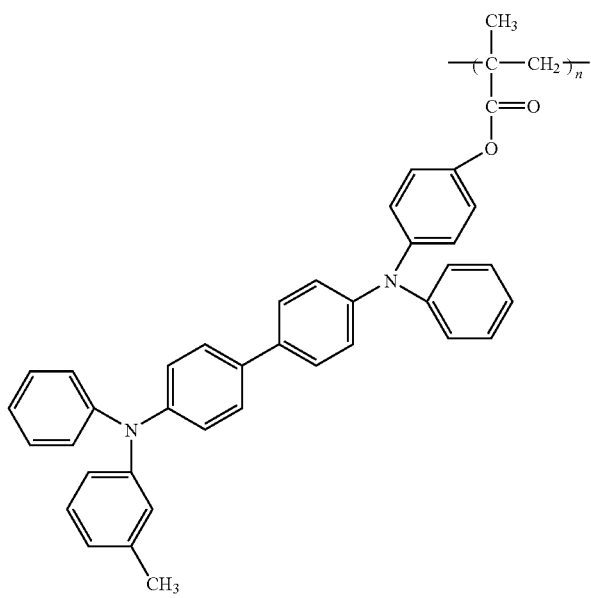
TPD-PMMA
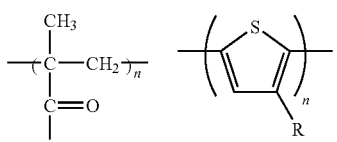
R : C6H13, C8H17, C12H25
Poly thiophene
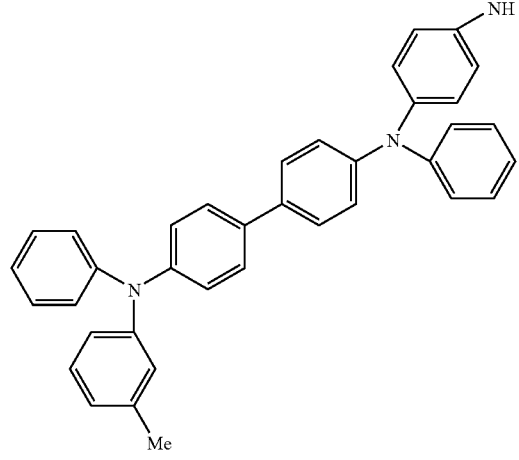
TPD-PMMA

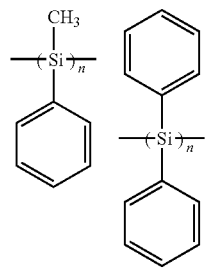

Polysilane

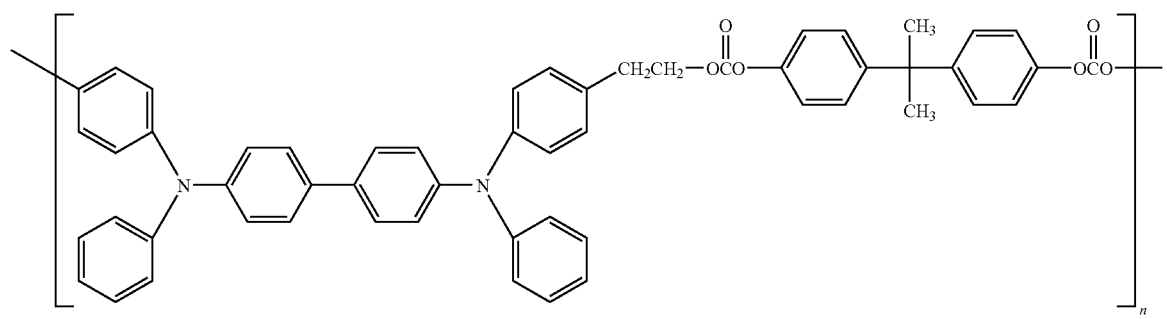

TPD-PCA

The electron-injecting/transporting material may be arbitrarily selected from compounds which facilitate the injection of an electron from a cathode and which has a function of transporting the implanted electron to an emission layer in consideration of the balance with the carrier mobility of the hole-transporting material. Materials having electron-injecting/transporting abilities include oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, and organometallic complexes. However, the material is not limited to those compounds. Some of the specific examples of the compounds will be described below.

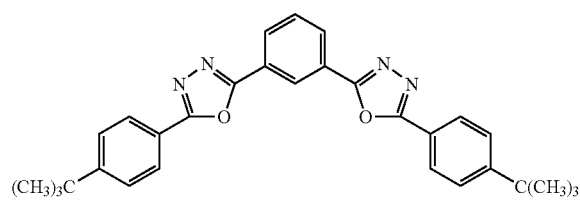

-continued

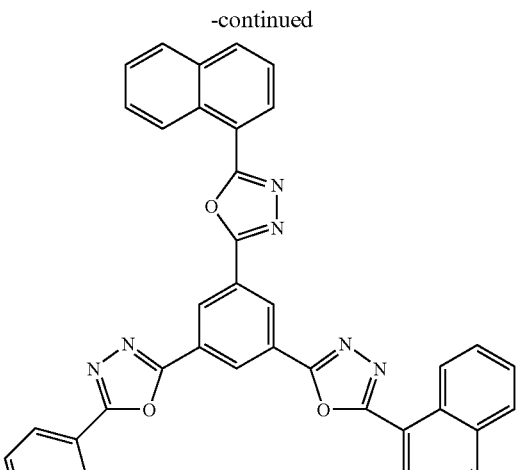

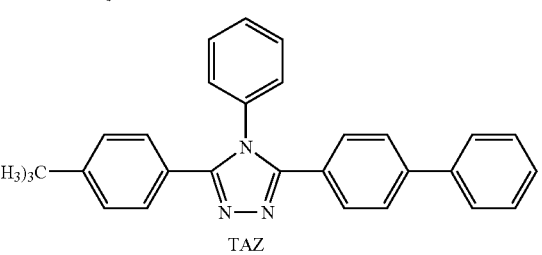

TAZ

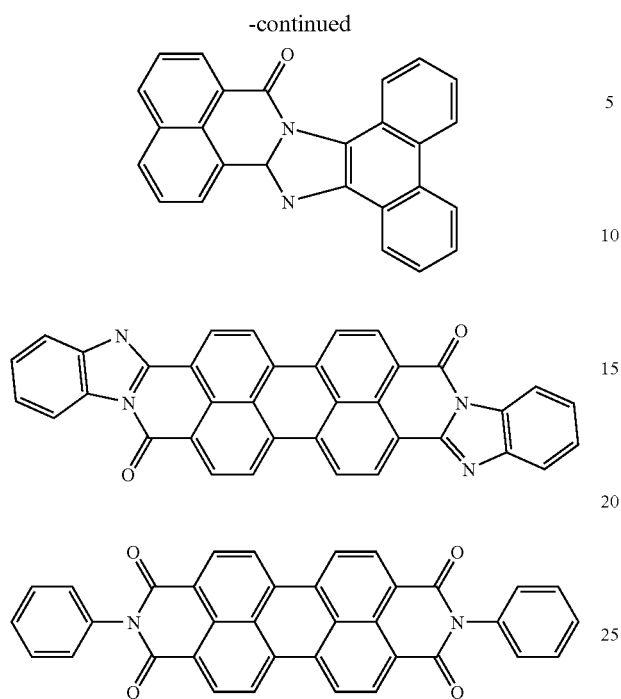
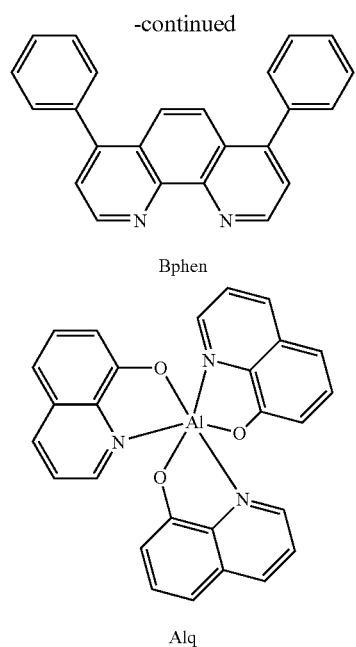
Bphen
Alq
A fluorescent dye or phosphorescent material having high luminescence efficiency can be used as the emitting material. Specific examples thereof will be described below.
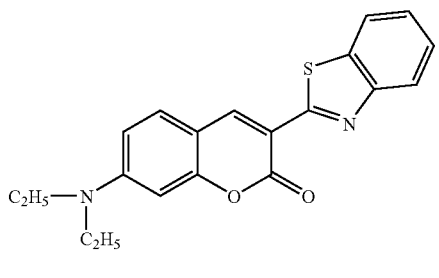
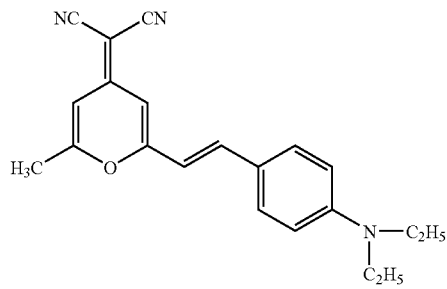
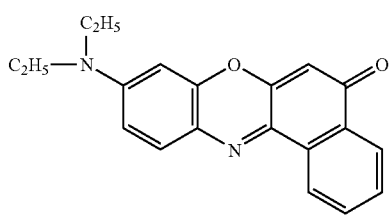
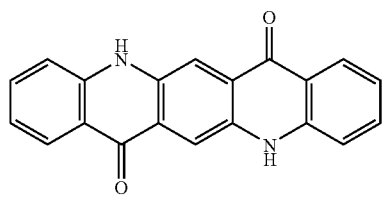
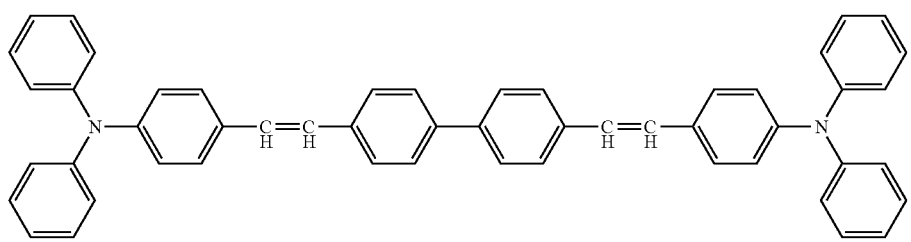

-continued

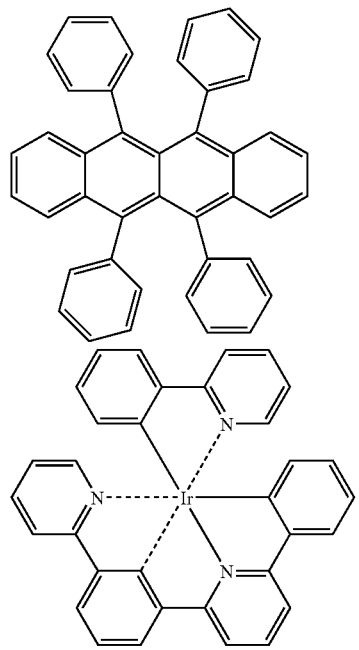
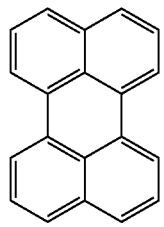

In the organic light emitting device according to the present invention, each layer containing an organic compound can be formed as a thin film generally by a vacuum evaporation method, an ionization deposition method, a sputtering method, a plasma method, or a conventional coating method (e.g., a spin coating, dipping, casting, LB, or inkjet method) in which the compound is dissolved in an appropriate solvent. In the case of forming a film with a coating method, in particular, a film may be formed using the compound in combination with an appropriate binder resin.

Such a binder resin may be chosen from among a wide variety of resins having a binder property. Examples thereof include, but are not limited to, polyvinylcarbazole resins, polycarbonate resins, polyester resins, polyarylate resins, polystyrene resins, ABS resins, polybutadine resins, polyurethane resins, acrylic resins, methacrylic resins, butyral resins, polyvinyl acetal resins, polyamide resins, polyimide resins, polyethylene resins, polyethersulfone resins, diallyl phthalate resins, phenol resins, epoxy resins, silicone resins, polysulfone resins, and urea resin. Each of those may also be used singly. Alternatively, two or more of them may be mixed in combination as copolymers. Further, additives such as known plasticizers, antioxidants and ultraviolet absorbers may be used in combination if required.

An anode material preferably has as large a work function as possible. Examples of the anode materials include: metals such as gold, platinum, silver, copper, nickel, palladium, cobalt, selenium, vanadium, tungsten and chromium, and alloys thereof; and metal oxides such as tin oxide, zinc oxide, indium oxide, indium tin oxide (ITO), and indium zinc oxide. Further, conductive polymers such as polyaniline, polypyrrole, polythiophene, and polyphenylene sulfide may also be used. Each of those electrode substances may be used singly. Alternatively, two or more of them may also be used in combination. Further, the anode may adopt any one of a single layer construction and a multilayer construction.

On the other hand, a cathode material preferably has as small a work function as possible. Examples of the cathode material include: metals such as lithium, sodium, potassium, calcium, magnesium, aluminum, indium, ruthenium, titanium, manganese, yttrium, silver, lead, tin, and chromium; and alloys composed of multiple metals such as lithium-indium, sodium-potassium, magnesium-silver, aluminum-lithium, aluminum-magnesium, and magnesium-indium alloys. Metal oxides such as indium tin oxide (ITO) may also be used. Each of those electrode substances may be used singly. Alternatively, two or more of them may also be used in combination. Further, the cathode may adopt any one of a single layer construction and a multilayer construction.

In addition, at least one of the anode and cathode is preferably transparent or translucent.

A substrate which may be used in the present invention includes: opaque substrates such as a metal substrate and a ceramics substrate; and transparent substrates such as of glass, quartz, and plastic sheet, but are not particularly limited to these materials. In addition, a color filter film, a fluorescent color converting film, a dielectric reflection film, or the like can be employed on the substrate to control the luminance color. Further, a device can be fabricated by forming a thin-film transistor (TFT) on the substrate and connecting thereto.

Regarding the light-emitting direction of the device, either a bottom emission structure (light is emitted from the substrate side) or a top emission structure (light is emitted from the side opposite to the substrate) is possible.

Furthermore, a protective layer or a sealing layer may be formed on the prepared device to prevent the device from coming into contact with oxygen, moisture, or the like. The protective layer may be a diamond thin film, a film made of an inorganic material such as metal oxide or metal nitride, a polymer film made of a fluorine resin, polyparaxylene, polyethylene, silicone resin, polystyrene resin, or the like, or may be a photo-curing resin, or the like. Furthermore, the device itself may be covered with glass, an airtight film, metal, or the like and packaged with an appropriate sealing resin.

The present invention will be more specifically described with reference to the following examples, but is not limited to the examples.

Example 1

An organic light emitting device having the structure shown in FIG. 7 was prepared in the following manner.

A transparent conductive substrate was formed by sputtering indium tin oxide (ITO) on a glass substrate as a substrate to form thereon an anode with a film thickness of 120 nm. Subsequently, this support substrate was subjected to ultrasonic cleaning in acetone and isopropyl alcohol (IPA) in order. Next, the support substrate was boiled and washed with IPA, followed by drying. Furthermore, the support substrate was subjected to UV/ozone cleaning for use as a transparent conductive substrate.

Using the compound DFLDPBi represented by the following structural formula as a hole-transporting material, a chloroform solution thereof was prepared so that the concentration of the compound was 0.2% wt %.

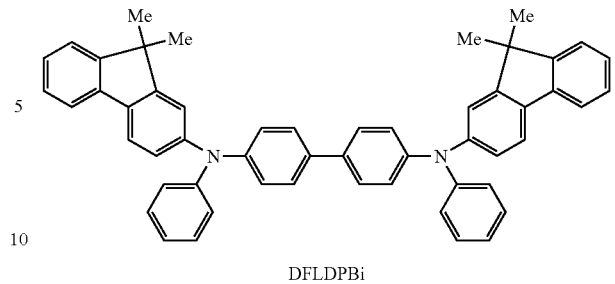

DFLDPBi

By dropping this solution onto the above-described ITO electrode, it was spin coated with the solution at a revolution speed of 500 rpm for 15 seconds at first and then 1,000 rpm for 1 minute to form a thin film thereon. After that, the resulting thin film was placed in a vacuum oven and dried at 80° C. for 10 minutes to completely remove the solvent in the thin film. The hole-transporting layer thus formed was 30 nm thick. Next, the following compound DPyFL as the host compound of the emission layer, the following luminescent compound s-DTAB2, and the following compound TFLFL were subjected to co-deposition (weight ratio=75:10:15) to form a 25 nm-thick emission layer 3. The degree of vacuum at the time of deposition was $1.0 \times 10^{-4}$ Pa and the deposition rate was 0.1 to 0.2 nm/second.

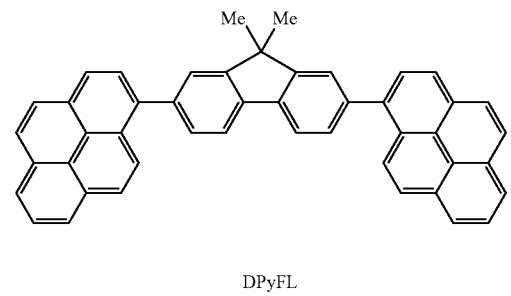

DPyFL

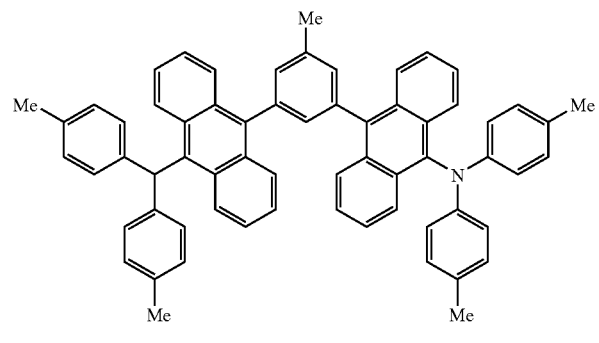

s-DTAB2

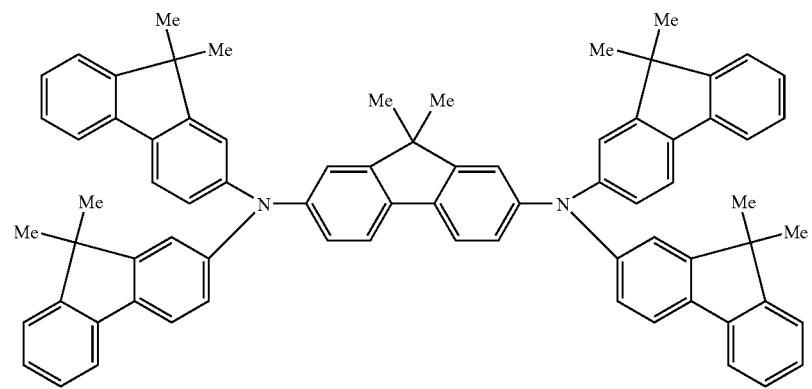

TFLFL

Further, using bathophenanthroline (Bphen), an electron-transporting layer with a thickness of 30 nm was formed by a vacuum evaporation method. The degree of vacuum at the time of deposition was $1.0 \times 10^{-4}$ Pa and the deposition rate was 0.1 to 0.2 nm/second.

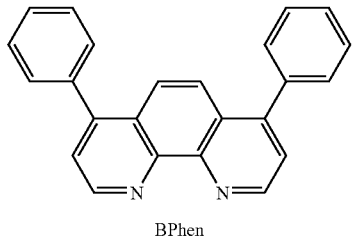

BPhen

Subsequently, a lithium fluoride film with a thickness of 0.5 nm was formed on the above-described organic layer by a vacuum evaporation method, and a 150 nm-thick aluminum film was formed thereon by a vacuum evaporation method, to thereby prepare an organic light emitting device. For the lithium fluoride film, the degree of vacuum at the time of deposition was $1.0 \times 10^{-4}$ Pa and the deposition rate was 0.05 nm/second. For the aluminum film, the degree of vacuum at the time of deposition was $1.0 \times 10^{-4}$ Pa and the deposition rate was 1.0 to 1.2 nm/second.

The resulting organic light emitting device was covered with a protective glass plate and sealed with an acrylic resin-based binder in a dry air atmosphere to prevent the device from deteriorating due to the adsorption of moisture.

From the device thus obtained, the emission of s-DTAB2-derived green light was observed with an emission luminance of 6,000 cd/m$^2$ and a maximum emission wavelength of 530 nm at an applied voltage of 4.0 V when the ITO electrode was provided as a positive electrode and the Al electrode was provided as a negative electrode.

Figure 8:
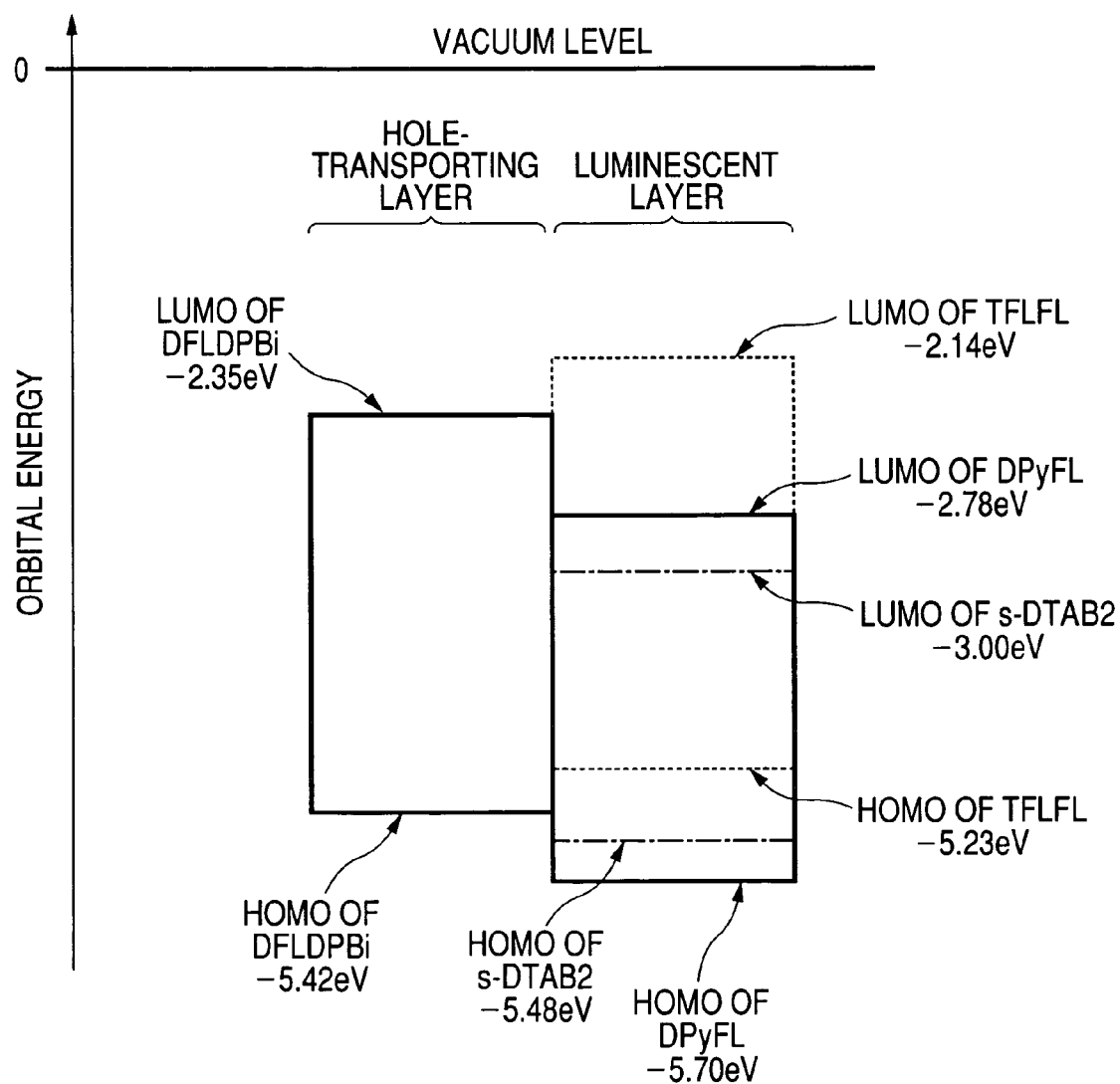
FIG. 8 is an energy diagram of the hole-transporting layer and the emission layer of the organic light emitting device according to Example 1 of the present invention.

From an ionization potential determinated using a measuring instrument model AC-1 (manufactured by Riken Kiki Co., Ltd.), and a band gap obtained by measurement of ultraviolet-visible light absorption, the HOMO/LUMO energy levels of each material were investigated. Energy diagrams for the hole-transporting layer and the emission layer are shown in FIG. 8.

The ionization potential of TFLFL was 5.23 eV, which was smaller than that of the hole-transporting material DFLDPBi 5.42 eV, and also smaller than that of the emitting material s-DTAB2 5.48 eV. Therefore, hole accumulation in the hole-transporting layer and hole accumulation in the emitting material are expected to be moderated by TFLFL.

Furthermore, hole mobility was measured by transient current measurement using the TOF (Time of Flight) method. Hole mobility for DFLDPBi was $1 \times 10^{-3}$ cm$^2$/Vs, and that for TFLFL was $1 \times 10^{-2}$ cm$^2$/Vs, which, in conjunction with their relative energy levels, strongly suggests that hole accumulation in the hole-transporting layer should be greatly moderated.

When a voltage was applied to the device for 500 hours under a nitrogen atmosphere while current density was kept at 30 mA/cm$^2$, the rate of luminance degradation after 500 hours was small because an initial luminance of about 5,700 cd/m$^2$ was changed to a luminance of about 4,000 cd/m$^2$ after 500 hours.

Comparative Example 1

An organic light emitting device was prepared in the same manner as in Example 1, except that the emission layer was changed to a layer formed by co-deposition of DPyFL and s-DTAB2 (concentration ratio=90:10).

From the device thus obtained, the emission of s-DTAB2-derived green light was observed with an emission luminance of 3,500 cd/m$^2$ and a maximum emission wavelength of 530 nm at an applied voltage of 4.0 V when the ITO electrode was provided as a positive electrode and the Al electrode was provided as a negative electrode.

When a voltage was applied to the device for 500 hours under a nitrogen atmosphere while current density was kept at 30 mA/cm$^2$, luminance degradation was greater than that of Example 1 because an initial luminance of about 4,800 cd/m$^2$ was changed to a luminance of about 2,100 cd/m$^2$ after 500 hours. The difference was due to the absence of TFLFL, wherein it is thought that in Example 1, hole accumulation in the hole-transporting layer and hole accumulation in the emitting material s-DTAB2 was substantially moderated by TFLFL.

Comparative Example 2

An organic light emitting device was prepared in the same manner as in Example 1, except that the emission layer was changed to a layer formed by co-deposition of DPyFL, s-DTAB2 and αNPD (concentration ratio=75:1.0:15).

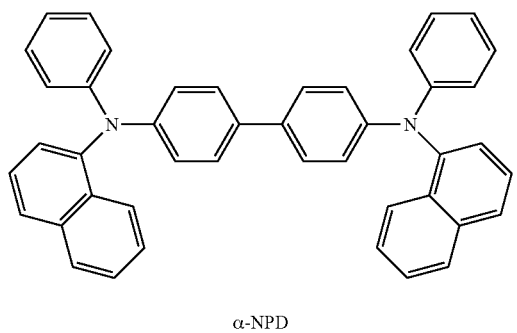

α-NPD

From the device thus obtained, the emission of s-DTAB2-derived green light was observed with an emission luminance of 3,600 cd/m$^2$ and a maximum emission wavelength of 530 nm at an applied voltage of 4.0 V when the ITO electrode was provided as a positive electrode and the Al electrode was provided as a negative electrode.

From the determination of ionization potential using a measuring instrument model AC-1 (manufactured by Riken Kiki Co., Ltd.), the ionization potential of the compound αNPD was 5.50 eV, which was greater than the ionization potential of the hole-transporting material DFLDPBi being 5.42 eV and the ionization potential of the emitting material s-DTAB2 being 5.48 eV. This means that αNPD is not believed to function effectively as the above-described another material.

When a voltage was applied to the device for 500 hours under a nitrogen atmosphere while current density was kept at 30 MA/cm$^2$, luminance degradation was greater than that of Example 1 because an initial luminance of about 4,700 cd/m² was changed to a luminance of about 2,100 cd/m² after 500 hours. The difference is believed to be due to the difference between TFLFL and αNPD, wherein αNPD has no effect of moderating hole accumulation in the hole-transporting layer and moderating hole accumulation in the emitting material s-DTAB2.

Comparative Example 3

An organic light emitting device was prepared in the same manner as in Example 1, except that the emission layer was changed to a layer formed by co-deposition of DPyFL, s-DTAB2, and DFLDPBi (concentration ratio=75:10:15).

From the device thus obtained, the emission of s-DTAB2-derived green light was observed with an emission luminance of 3,700 cd/m² and a maximum emission wavelength of 530 nm at an applied voltage of 4.0 V when the ITO electrode was provided as a positive electrode and the Al electrode was provided as a negative electrode.

Since the ionization potential of the DFLDPBi co-deposited on the emission layer is the same as the ionization potential of the hole-transporting layer, (the hole-transporting layer also consisting of DFLDPBi), DFLDPBi is not believed to function adequately as the above-described another material.

When a voltage was applied to the device for 500 hours under a nitrogen atmosphere while current density was kept at 30 mA/cm², luminance degradation was greater than that of Example 1, because an initial luminance of about 5,800 cd/m² was changed to a luminance of about 3,100 cd/m² after 500 hours. The difference is believed to be due to the difference between TFLFL and DFLDPBi, wherein DFLDPBi has little effect of moderating hole accumulation in the hole-transporting layer and moderating hole accumulation in the emitting material s-DTAB2.

Example 2

An organic light emitting device was prepared in the same manner as in Example 1, except that the emission layer was changed to an emission layer having a total film thickness of 25 nm which consists of a 15 nm-thick layer on the hole-transporting layer side which was co-deposited with three kinds of DPyFL, s-DTAB2 and TFLFL (concentration ratio=75:10:15), and a 10 nm-thick layer which was subsequently co-deposited with two kinds of DPyFL and s-DTAB2 (concentration ratio=90:10).

From the device thus obtained, the emission of s-DTAB2-derived green light was observed with an emission luminance of 6,000 cd/m² and a maximum emission wavelength of 530 nm at an applied voltage of 4.0 V when the ITO electrode was provided as a positive electrode and the Al electrode was provided as a negative electrode.

When a voltage was applied to the device for 500 hours under a nitrogen atmosphere while current density was kept at 30 mA/cm², the rate of luminance degradation after 500 hours was small because an initial luminance of about 5,700 cd/m² was changed to a luminance of about 3,900 cd/m² after 500 hours.

Comparative Example 4

An organic light emitting device was prepared in the same manner as in Example 1, except that the emission layer was changed to an emission layer having a total film thickness of 25 nm which consists of a 15 nm-thick layer on the hole-transporting layer side which was co-deposited with two kinds of DPyFL and s-DTAB2 (concentration ratio=90:10), and a 10 nm-thick layer which was subsequently co-deposited with three kinds of DPyFL, s-DTAB2 and TFLFL (concentration ratio=75:10:15).

From the device thus obtained, the emission of s-DTAB2-derived green light was observed with an emission luminance of 3,500 cd/m² and a maximum emission wavelength of 530 nm at an applied voltage of 4.0 V when the ITO electrode was provided as a positive electrode and the Al electrode was provided as a negative electrode.

When a voltage was applied to the device for 500 hours under a nitrogen atmosphere while current density was kept at 30 mA/cm², luminance degradation was greater than that of Example 1 because an initial luminance of about 4,800 cd/m² was changed to a luminance of about 2,300 cd/m² after 500 hours. This is thought to be due to the fact that because the hole-transporting side of the emission layer was not doped with TFLFL, hole injection from the hole-transporting layer to the emission layer did not proceed quickly.

Example 3

An organic light emitting device was prepared in the same manner as in Example 1, except that the electron-transporting material was changed to 2,9-bis[2-(9,9-dimethylfluorenyl)] phenanthroline.

From the device thus obtained, the emission of s-DTAB2-derived green light was observed with an emission luminance of 6,000 cd/m² and a maximum emission wavelength of 530 nm at an applied voltage of 4.0 V when the ITO electrode was provided as a positive electrode and the Al electrode was provided as a negative electrode.

When a voltage was applied to the device for 500 hours under a nitrogen atmosphere while current density was kept at 30 mA/cm², the rate of luminance degradation after 500 hours was extremely small because an initial luminance of about 6,000 cd/m² was changed to a luminance of about 4,500 cd/m² after 500 hours.

Example 4

An organic light emitting device was prepared in the same manner as in Example 1, except that the emission layer was changed to a layer formed by co-deposition of DPyFL, st-BTAB2 and TFLFL (concentration ratio=75:10:15).

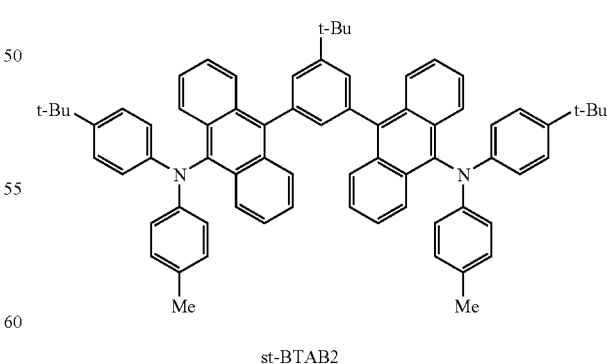

st-BTAB2

From the device thus obtained, the emission of st-BTAB2-derived green light was observed with an emission luminance of 6,000 cd/m² and a maximum emission wavelength of 525 nm at an applied voltage of 4.0 V when the ITO electrode was provided as a positive electrode and the Al electrode was provided as a negative electrode.

The measured ionization potential of the emitting material st-BTAB2 was 5.49 eV.

When a voltage was applied to the device for 500 hours under a nitrogen atmosphere while current density was kept at 30 mA/cm$^2$, the rate of luminance degradation after 500 hours was small because an initial luminance of about 5,500 cd/m$^2$ was changed to a luminance of about 3,900 cd/m$^2$ after 500 hours.

Example 5

An organic light emitting device was prepared in the same manner as in Example 1, except that the emission layer was changed to a layer formed by co-deposition of t-DPyFL, BDT3FL and TFLFL (concentration ratio=80:10:10), and the electron-transporting material was changed to 2,9-bis[2-(9,9-dimethylfluorenyl)]phenanthroline.

BDT3FL being 5.31 eV. For this reason, the hole accumulation in the hole-transporting layer and the hole accumulation in the emission layer are expected to be moderated by TFLFL. Hole accumulation in the emitting material BDT3FL is also expected to be moderated.

When a voltage was applied to the device for 100 hours under a nitrogen atmosphere while current density was kept at 30 mA/cm$^2$, the rate of luminance degradation after 100 hours was small because an initial luminance of about 1,200 cd/m$^2$ was changed to a luminance of about 830 cd/m$^2$.

Comparative Example 5

An organic light emitting device was prepared in the same manner as in Example 5, except that the emission layer was changed to a layer formed by co-deposition of t-DPyFL and BDT3FL (concentration ratio=90:10).

From the device thus obtained, the emission of BDT3FL-derived blue light was observed with an emission luminance

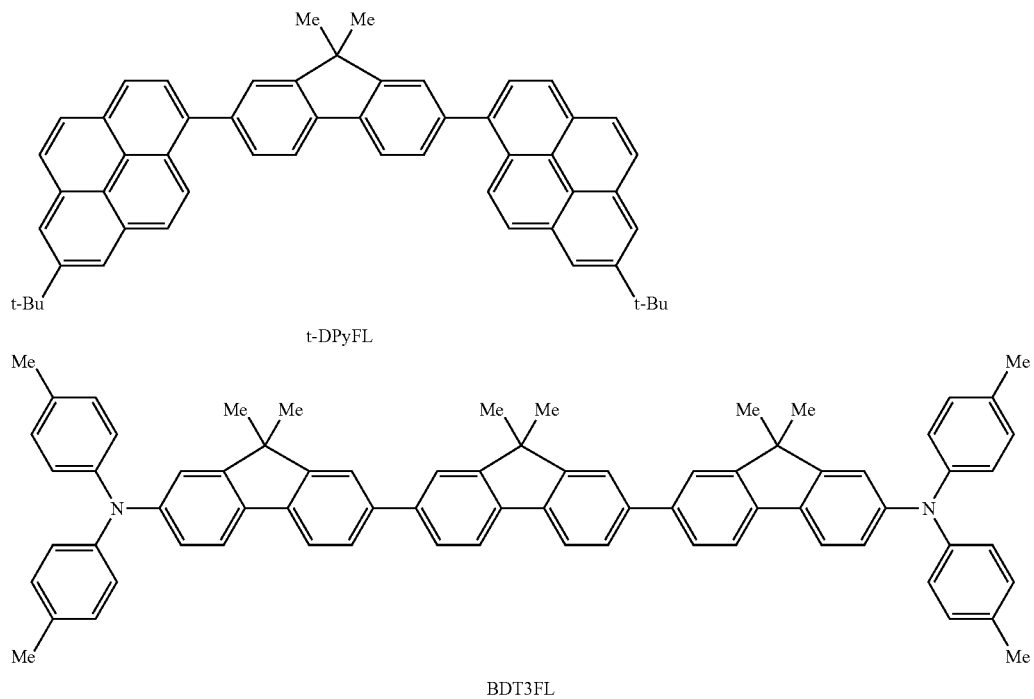

From the device thus obtained, the emission of st-BTAB2-derived blue light was observed with an emission luminance of 1,000 cd/m$^2$ and a maximum emission wavelength of 470 nm at an applied voltage of 4.0 V when the ITO electrode was provided as a positive electrode and the Al electrode was provided as a negative electrode.

Figure 9:
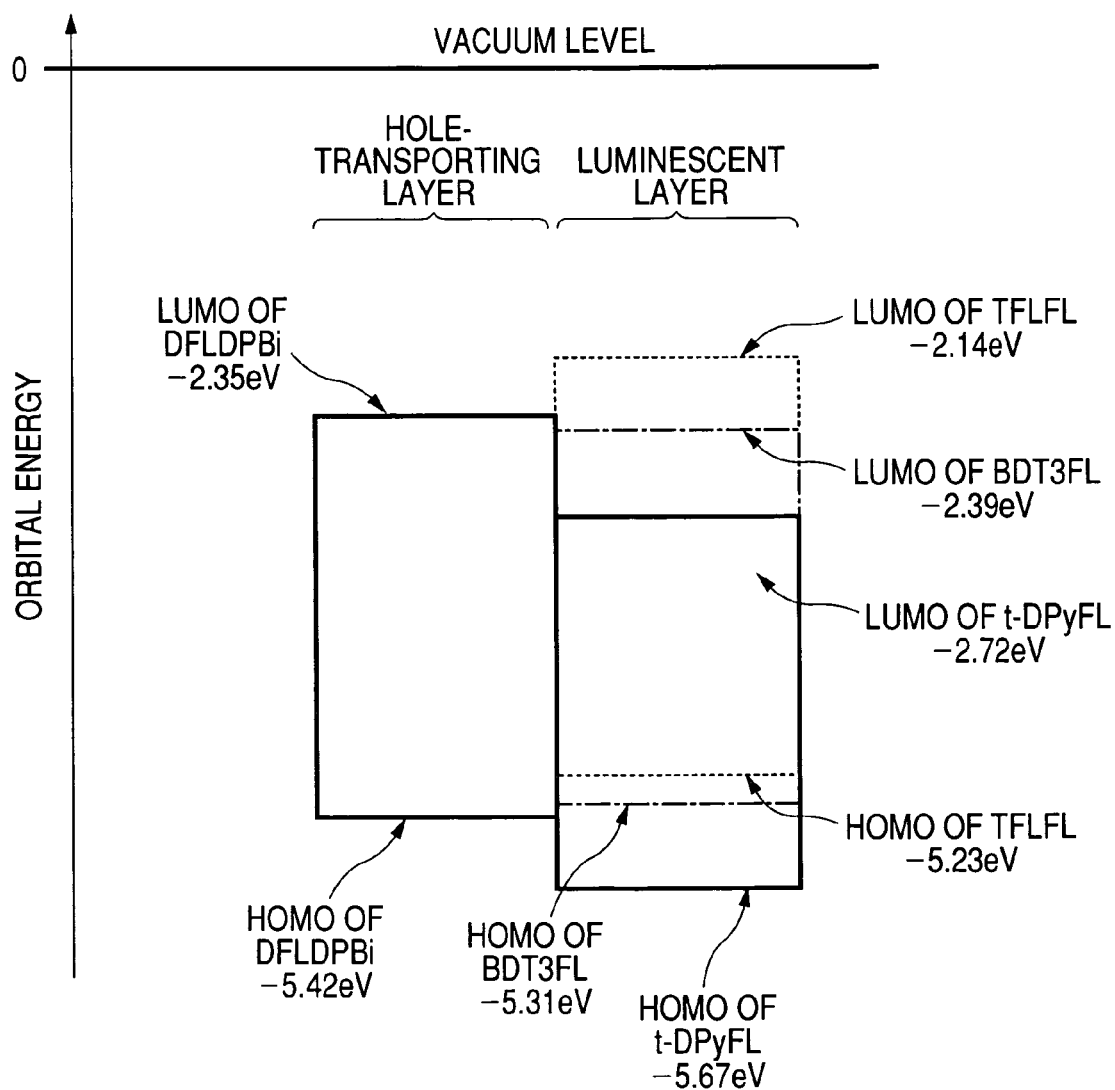
FIG. 9 is an energy diagram of the hole-transporting layer and the emission layer of the organic light emitting device according to Example 5 of the present invention.

In addition, from ionization potential measurement using a measuring instrument model AC-1 (manufactured by Riken Kiki Co., Ltd.), and a band gap measurement with ultraviolet through visible light absorption, the HOMO/LUMO energy of each material was investigated. Energy diagrams for the hole-transporting layer and the emission layer are shown in FIG. 9.

The ionization potential of the compound TFLFL was 5.23 eV, which was smaller than the ionization potential of the hole-transporting material DFLDPBi being 5.42 eV, and also smaller than the ionization potential of the emitting material of 600 cd/m$^2$ and a maximum emission wavelength of 445 nm at an applied voltage of 4.0 V when the ITO electrode was provided as a positive electrode and the Al electrode was provided as a negative electrode.

When a voltage was applied to the device for 100 hours under a nitrogen atmosphere while current density was kept at 30 MA/cm$^2$, the rate of luminance degradation greater than that in Example 5 because an initial luminance of about 1,000 cd/m$^2$ was changed to a luminance of about 600 cd/m$^2$ after 100 hours.

The difference was due to the absence of TFLFL, wherein it is thought that hole accumulation in the hole-transporting layer and hole accumulation in the emitting material BDT3FL are substantially moderated by TFLFL.

This application claims priority from Japanese Patent Application No. 2004-211231 filed Jul. 20, 2004, which is hereby incorporated by reference herein.

What is claimed is:

1. An organic light emitting device comprising a pair of electrodes which consist of an anode and a cathode and a plurality of organic layers interposed between the pair of electrodes,
   wherein the plurality of organic layers include at least an emission layer and another organic layer which is in contact with an anode-side-interface of the emission layer, and
   wherein the emission layer includes at least:
   (1) a host material;
   (2) a light emitting material; and
   (3) another material which, in comparison with a material constituting an emission layer-surface-side of the another organic layer has a smaller ionization potential and has almost the same hole mobility, wherein the another material has an ionization potential smaller than an ionization potential of the emitting material and wherein the emitting material has a band gap smaller than both band gaps of the host material and the another material.

2. The organic light emitting device according to claim 1, wherein the another material is contained in at least an anode-side of the emission layer.

3. The organic light emitting device according to claim 1, wherein the plurality of organic layers further includes an electron-transporting layer including 2,9-bis[2-(9,9-dimethylfluorenyl)]phenanthroline.

* * * * *